(12) United States Patent
Nakamura et al.

(10) Patent No.: US 9,382,893 B2
(45) Date of Patent: Jul. 5, 2016

(54) SEMICONDUCTOR DEVICE

(71) Applicant: FUJI ELECTRIC CO., LTD., Kawasaki-shi (JP)

(72) Inventors: Hiroshi Nakamura, Matsumoto (JP); Shigemi Miyazawa, Matsumoto (JP); Hideki Miura, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/790,072

(22) Filed: Jul. 2, 2015

(65) Prior Publication Data

US 2016/0032883 A1   Feb. 4, 2016

(30) Foreign Application Priority Data

Aug. 1, 2014   (JP) ................. 2014-157690

(51) Int. Cl.
  *F02P 3/04* (2006.01)
  *F02P 3/055* (2006.01)
  *H03K 17/16* (2006.01)
  (Continued)

(52) U.S. Cl.
  CPC .......... *F02P 3/0552* (2013.01); *H03K 17/0828* (2013.01); *H03K 17/163* (2013.01); *H03K 17/168* (2013.01); *F02P 3/0453* (2013.01); *H03K 17/0822* (2013.01)

(58) Field of Classification Search
  CPC ........................................................ F02P 3/04
  USPC .......... 123/650–652, 655–656; 315/191–193, 315/196, 209 T, 209 PZ
  See application file for complete search history.

(56) References Cited

U.S. PATENT DOCUMENTS 6,348,797 B1 * 2/2002 Shimizu .................. F02P 17/12
                                                  324/378
7,671,636 B2   3/2010 Aoki et al.
7,777,518 B2   8/2010 Toyoda et al.
(Continued)

FOREIGN PATENT DOCUMENTS

EP     711038 A2   5/1996
EP    1284362 A1   2/2003
(Continued)

OTHER PUBLICATIONS

European Search Report issued in counterpart application No. EP15175381.1, dated Dec. 18, 2015.

*Primary Examiner* — Minh D A
(74) *Attorney, Agent, or Firm* — Rossi, Kimms & McDowell LLP

(57) ABSTRACT

Aspects of the invention include a semiconductor device that includes a voltage-controlled type semiconductor element connected to a primary side of an ignition coil for supplying a voltage to an ignition device of an internal combustion engine, a first resistor and a second resistor inserted in series in a supplying path of an input signal for controlling a gate of the voltage-controlled type semiconductor element and a current control circuit including a current limiting circuit for controlling current flowing through the voltage-controlled type semiconductor element. Aspects of the invention also include a first by-pass forming element that is connected in parallel to the second resistor and by-passes the second resistor in a turning ON process of the voltage-controlled type semiconductor element, and a second by-pass forming element that is connected in parallel to the first resistor and the second resistor.

7 Claims, 6 Drawing Sheets

(51) Int. Cl.
*F02P 3/045* (2006.01)
*H03K 17/082* (2006.01)

(56) References Cited

U.S. PATENT DOCUMENTS

| | | |
|---|---|---|
| 2005/0146822 A1 | 7/2005 | Ando et al. |
| 2006/0022609 A1 | 2/2006 | Yukutake et al. |
| 2010/0163922 A1 | 7/2010 | Yoneda et al. |
| 2014/0015005 A1 | 1/2014 | Ishii |

FOREIGN PATENT DOCUMENTS

| | | | |
|---|---|---|---|
| EP | 2654207 | A2 | 10/2013 |
| JP | 2000232347 | A | 8/2000 |
| JP | 2001153012 | A | 6/2001 |
| JP | 2002371945 | A | 12/2002 |
| JP | 2006037822 | A | 2/2006 |
| JP | 2008045514 | A | 2/2008 |
| JP | 2008054280 | A | 3/2008 |
| JP | 2009284420 | A | 12/2009 |
| JP | 2014013796 | A | 1/2014 |

* cited by examiner

SEMICONDUCTOR DEVICE

CROSS-REFERENCE TO RELATED APPLICATION

This application is based on, and claims priority to, Japanese Patent Application No. 2014-157690, filed on Aug. 1, 2014, contents of which are incorporated herein by reference.

BACKGROUND OF THE INVENTION

1. Field of the Invention

Aspects of the invention relates to onboard semiconductor devices having a voltage-controlled type semiconductor elements.

2. Description of the Related Art

A semiconductor device is provided with a voltage-controlled type semiconductor element composed of an insulated gate bipolar transistor, a power MOSFET, or the like. Japanese Unexamined Patent Application Publication No. 2006-037822 (also referred to herein as "Patent Document 1") discloses an onboard semiconductor device used for an ignition control device for an internal combustion engine, in which an end of the primary winding of an ignition coil is connected to a battery and the other end is connected to the ground through a voltage-controlled type semiconductor element. To turn ON the voltage-controlled type semiconductor element, an external electronic control unit (ECU) delivers an input signal at a specified voltage to an input terminal of the voltage-controlled type semiconductor element 21 through a gate resistor, thereby raising the gate voltage to turn ON the voltage-controlled type semiconductor element.

On the other hand, to turn OFF the voltage-controlled type semiconductor element, the charges accumulated on the gate capacitance of the voltage-controlled type semiconductor element are discharged toward the external electronic control unit. The discharging circuit comprises a series circuit of a speed-up diode and a resistor in parallel to the gate resistor for by-passing the gate resistor in the discharging process. This circuit construction increases dI/dt of the gate current in the discharging process. The resistance value of the gate resistor is set in the range of 1 to 10 kΩ, and the resistance value of the resistor connected to the speed-up diode in series is set in the range of 50Ω to 1 kΩ.

In the conventional device disclosed in Patent Document 1, the input signal is delivered through the gate resistor in the process of turning ON the voltage-controlled type semiconductor element, and the charges in the gate capacitance are discharged in the process of turning OFF by-passing the gate resistor by the series circuit of the speed-up diode and the resistor. Thus, the two different paths are formed for the processes of turning ON and turning OFF of the voltage-controlled type semiconductor element.

This type of semiconductor device is vulnerable to high frequency noise at an order of several MHz such as radio noise. When a high frequency noise is superposed on a signal line for delivering the input signal to the voltage-controlled type semiconductor element, the gate potential of the voltage-controlled type semiconductor element oscillates in the range of 0 to about 10 V due to the high frequency noise. The oscillation of the gate potential of the voltage-controlled type semiconductor element generates oscillating charge and discharge for the gate potential. FIG. 3 illustrates the oscillation of the gate potential. The high frequency noise is assumed to have a high frequency sinusoidal waveform, as shown by the waveform (a) in FIG. 3. A positive direction of current flow is defined as the direction toward the gate of the voltage-controlled type semiconductor element, and a negative direction is defined as the direction from the gate of the voltage-controlled type semiconductor element toward the input signal supplying side.

When a harmonic wave is superposed on the delivered input signal, during the period from the starting time t20 to the time t21, shown by the waveform (c) in FIG. 3, the gate capacitance of the voltage-controlled type semiconductor element is charged through a relatively large gate resistance, changing the gate current Ig.

Then during the period from the time t21 to the time t22, the gate potential increases in the negative direction and the charges on the gate capacitance of the voltage-controlled type semiconductor element are discharged toward the input signal supplying side. In this period, however, the gate potential does not exceed the forward voltage drop Vf, which is 0.6 V, for example, of the speed-up diode, and thus the speed-up diode remains in an OFF state and the current flows through the gate resistor toward the input signal supplying side.

Then, at the time t22, the speed-up diode turns ON and the charges on the gate capacitance of the voltage-controlled type semiconductor element are discharged through the speed-up diode and a resistor having a relatively low resistance toward the input signal supplying side. As a consequence, the gate current rapidly increases in the negative direction and then decreases until the time t23 at which the speed-up diode returns into an OFF state. After that, the current flows again through the gate resistor from the gate of the voltage-controlled type semiconductor element, with a slow decreasing rate of the gate current Ig.

Then, at the time t24, the gate current from the input signal supplying side to charge the gate capacitance of the voltage-controlled type semiconductor element 21 starts to increase in the positive direction similarly to the event at the time t20.

The current running in the gate wiring has a larger amplitude of the gate current −Ig flowing during the period between t21 and t24 than the amplitude of the gate current +Ig flowing during the period between t20 and t21. Thus, when a high frequency noise is superposed on the input signal, the average value of the gate current Ig significantly decreases below zero, as indicated by the dotted characteristic line L1 in the waveform (c) in FIG. 3.

Because the average value of the gate current Ig significantly decreases below zero when a high frequency noise is superposed on the input signal, a phenomenon occurs that the average value of the gate voltage decreases below the input signal of 5V. When charging and discharging, or ON and OFF, of the gate voltage are repeated due to a high frequency noise, the speed of charging and the speed of discharging are different from each other on the gate capacitance of the voltage-controlled type semiconductor element. The apparent drop of the gate potential decreases the current that flows through the voltage-controlled type semiconductor element. Thus, a problem arises that the output in the secondary winding of the ignition coil decreases.

SUMMARY OF THE INVENTION

Embodiments of the invention have been made in view of the problems in conventional technologies, and embodiments of the invention provide a semiconductor device that avoids decrease in the gate potential of a voltage-controlled type semiconductor element.

Embodiments of the invention comprise: a voltage-controlled type semiconductor element connected to a primary side of an ignition coil for supplying a voltage to an ignition device of an internal combustion engine; a first resistor and a second resistor inserted in series in a supplying path of an input signal for controlling a gate of the voltage-controlled type semiconductor element; a current control circuit for controlling current flowing through the voltage-controlled type semiconductor element; a first by-pass forming element that is connected in parallel to the second resistor and by-passes the second resistor in a turning ON process of the voltage-controlled type semiconductor element; a second by-pass forming element that is connected in parallel to the first resistor and the second resistor and by-passes the first and second resistors in a turning OFF process of the voltage-controlled type semiconductor element; wherein the current control circuit includes an active element that is connected to a node between the first resistor and the second resistor and pulls down a gate voltage.

A semiconductor device of some embodiments restricts the difference in the speed of charging and discharging of the gate capacitance of a voltage-controlled type semiconductor element, and avoids the drop of the gate potential of the voltage-controlled type semiconductor element due to a high frequency noise, thereby preventing the output in the secondary side of an ignition coil from lowering.

BRIEF DESCRIPTION OF DRAWINGS

FIGS. 6A and 6B are circuit diagrams of an ignition control device for an internal combustion engine, wherein FIG. 6A shows a circuit diagram of a semiconductor device having a current control device comprising a current limiting circuit and an overcurrent control circuit, and FIG. 6B shows a circuit diagram of a semiconductor device having a current control device comprising a current limiting circuit and an overheat control circuit.

DETAILED DESCRIPTION

Figure 1:
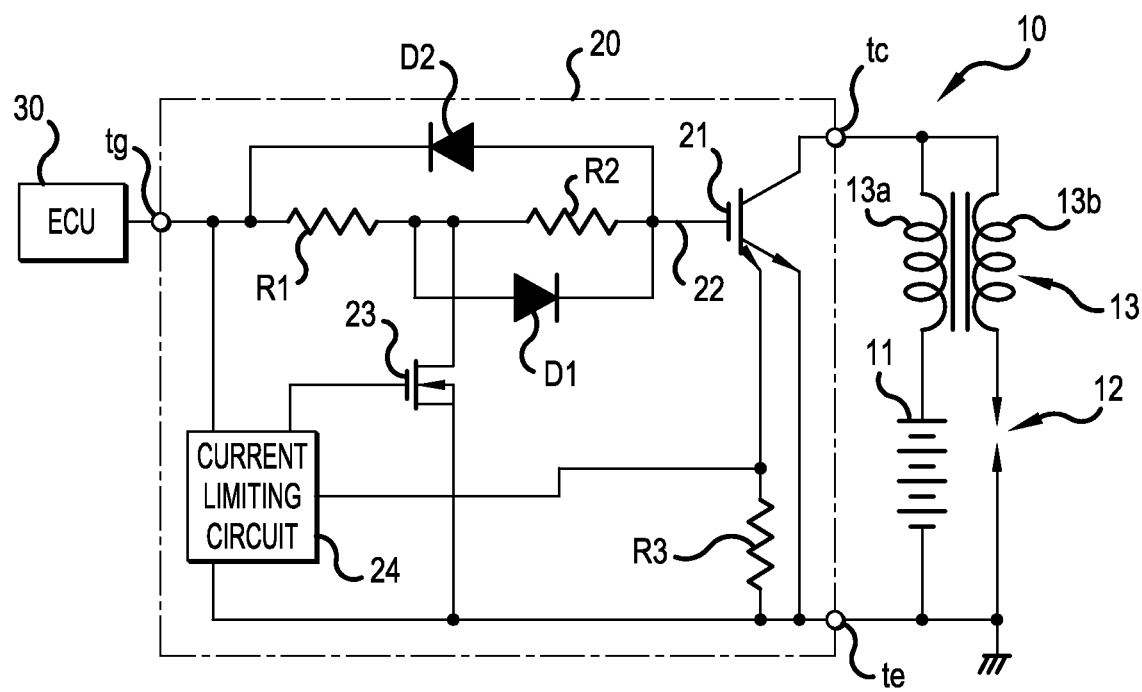
FIG. 1 is a circuit diagram of an ignition control device for an internal combustion engine including a semiconductor device according to a first embodiment of the present invention.

The following describes in detail an ignition control device for an internal combustion engine including a semiconductor device according to an embodiment example of the present invention with reference to FIG. 1.

The ignition control device 10 as shown in FIG. 1 comprises an ignition coil 13 that receives a power supply voltage from a battery 11 in the primary side and that is connected to an ignition device 12 composed of an ignition plug in the secondary side. The primary side of the ignition coil 13 is connected to a semiconductor device 20 composing a one-chip igniter, for example. The semiconductor device 20 receives an input signal that is an ignition signal from an electronic control unit (ECU) 30.

The semiconductor device 20 has a collector terminal tc connected to a primary winding 13a of the ignition coil 13 at the opposite side of the battery 11, an emitter terminal te connected to the ground, and a gate terminal tg connected to the electronic control unit 30.

Between the collector terminal tc and the emitter terminal te connected is a voltage-controlled type semiconductor element 21 composed of an insulated gate bipolar transistor (IGBT), a power MOS field effect transistor, or the like. The voltage-controlled type semiconductor element 21 has a high potential terminal of a collector connected to the collector terminal tc and a low potential terminal of an emitter connected to the emitter terminal te. The voltage-controlled type semiconductor element 21 has a control terminal of a gate connected to the gate terminal tg through a gate wiring 22 that is a path for input signal supply.

The gate wiring 22 has at least two resistors inserted in series on the gate wiring 22: a first resistor R1 in the side of the gate terminal tg, and second resistor R2 in the side of the gate of the voltage-controlled type semiconductor element 21. The resistance value of the first resistor R1 is higher than that of the second resistor R2. For example, the resistance value of the first resistor R1 is relatively large value of about 5 kΩ and the resistance value of the second resistor R2 is relatively small value of about 2 kΩ.

The second resistor R2 is connected in parallel to a first diode D1 that is a first by-pass forming element for speed-up of turning ON process of the voltage-controlled type semiconductor element 21. The anode of the first diode D1 is connected to a node between the first resistor R1 and the second resistor R2 on the gate wiring 22, and the cathode of the first diode D1 is connected to a node between the second resistor R2 and the gate of the voltage-controlled type semiconductor element 21 on the gate wiring 22.

The first resistor R1 and the second resistor R2 are connected in parallel to a second diode D2 that is a second by-pass forming element for speed-up of turning OFF process of the voltage-controlled type semiconductor element 21. The anode of the second diode D2 is connected to a node between the second resistor R2 and the gate of the voltage-controlled type semiconductor element 21 on the gate wiring 22, and the cathode of the second diode D2 is connected to a node between the first resistor R1 and the gate terminal tg on the gate wiring 22. The first diode D1 and the second diode D2 are, for example, a PN junction type diode. However, they can be a Schottky barrier diode exhibiting a lower forward voltage drop than the PN junction type diode.

An active element 23 composed of an N channel MOSFET for current limiting is connected between the node between the first resistor R1 and the second resistor R2 and the emitter terminal te. The gate of the active element 23 receives an input signal from a current limiting circuit 24 that is a component of a current control circuit.

The current limiting circuit 24 is connected between a node between the gate terminal tg and the first resistor R1 and the emitter terminal te, and operates with a power supply of the input signal, which is at 5 V, for example, supplied by the electronic control unit 30. The current limiting circuit 24 receives a current detection value of the terminal voltage at the current sensing terminal of a current detecting resistor R3 connected between the current sensing terminal of the voltage-controlled type semiconductor element 21 and the emitter terminal te. When the collector current Ic of the voltage-controlled type semiconductor element 21 reaches a current limiting value Ilim, the current limiting circuit 24 controls the active element 23 to reduce the gate voltage Vg so that the current limiting value Ilim is maintained.

The electronic control unit 30 delivers an input signal of a voltage signal at a high level during a predetermined ignition period to the gate terminal tg every time a predetermined ignition time for igniting the ignition device 12 arrives.

Now, an ignition operation in the embodiment described above is described in the following with reference to FIG. 2. First, an input signal of a voltage signal at a high level is delivered during a predetermined period, as shown in the time chart (a) in FIG. 2, at a predetermined ignition time for the ignition device 12 from the electronic control unit 30 to the gate terminal tg of the semiconductor device 20.

Figure 2:
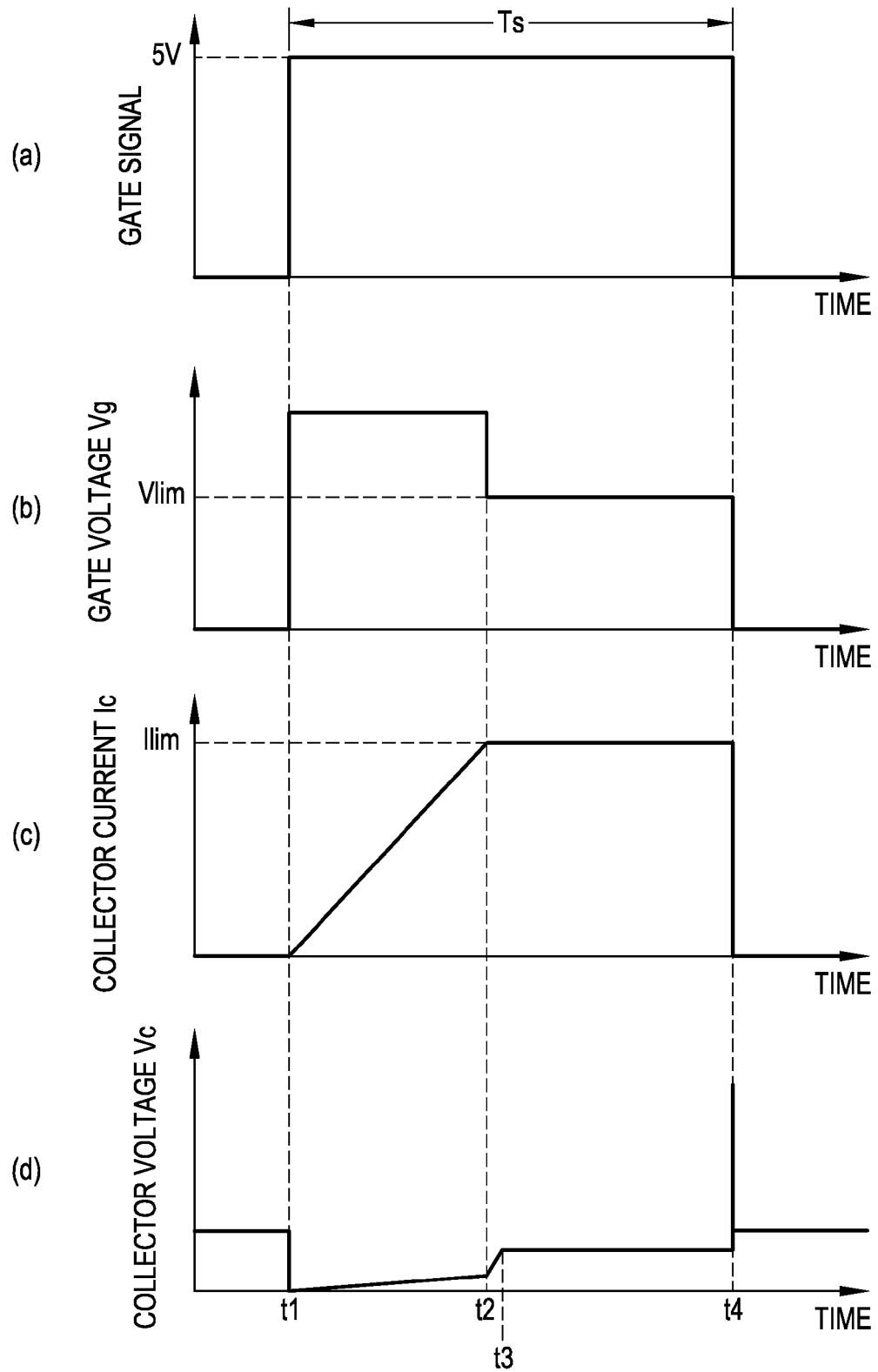
FIG. 2 shows time charts illustrating an ignition operation of the semiconductor device according to the first embodiment of the present invention.

As a result, at the time t1 when the input signal rises from a low level to a high level, the gate voltage Vg turns to a high level, 5 V for example, as shown in the time chart (b) in FIG. 2, to turn ON the voltage-controlled type semiconductor element 21. As a result, collector current Ic starts flowing, as shown by the time chart (c) in FIG. 2, from the battery 11 through the primary winding 13a of the ignition coil 13 and the collector terminal tc of the semiconductor device 20 to the collector of the voltage-controlled type semiconductor element 21. The current variation rate dI/dt of the collector current Ic is determined by the inductance of the ignition coil 13 and the voltage value applied to the primary winding 13a of the ignition coil 13.

At the same time, the collector voltage Vc of the voltage-controlled type semiconductor element 21 drops to the ground level, as shown by the time chart (d) in FIG. 2.

In this state, in which the collector current Ic is below the current limiting value Ilim, the input signal to the current limiting circuit 24 is at a low level and the active element 23 maintains the OFF state.

After that, at the time t2 when the collector current Ic through the voltage-controlled type semiconductor element 21 reaches the current limiting value Ilim, an input signal at a high level is delivered from the current limiting circuit 24 to the gate of the active element 23 to turn ON the active element 23. As a result, the gate voltage Vg of the voltage-controlled type semiconductor element 21 is pulled down by the active element 23 through the second resistor R2. As a result, as shown by the time chart (b) in FIG. 2, the gate voltage Vg is reduced to the voltage value Vlim, for example 3 V, that is a voltage to maintain the collector current Ic through the voltage-controlled type semiconductor element 21 at the current limiting value Ilim. In this time, the charges on the gate capacitance of the voltage-controlled type semiconductor element 21 are discharged through the second resistor R2 and the active element 23. Thus, an immediate discharge from the gate capacitance is avoided when the active element 23 turns ON. Therefore, the pull-down operation is performed stably.

The collector voltage Vc rises slowly, as shown by the time chart (d) in FIG. 2, according to L (dI/dt), wherein L is the inductance of the ignition coil 13 and (dI/dt) is a current variation rate through the ignition coil 13. After the time t3, the collector voltage Vc maintains a low, constant voltage value in the range of 3 to 5 volts.

During the ON state of the voltage-controlled type semiconductor element 21, electromagnetic energy is stored in the primary winding 13a of the ignition coil 13. Then at the time t4 when the predetermined ignition period Ts for the input signal has expired and the input signal returns to the low level, as shown in the time chart (a) in FIG. 2, the charges on the gate of the voltage-controlled type semiconductor element 21 are drawn out quickly through the second diode D2 for speed-up toward the electronic control unit 30, turning OFF the voltage-controlled type semiconductor element 21. As a result, the collector current Ic abruptly drops, which causes abrupt rise of the voltage across the primary winding 13a of the ignition coil 13. At the same time, the voltage across the secondary winding 13b also rises up to a high voltage of 30 kV, for example, which is applied to the ignition device 12. The ignition device 12 generates spark discharge at a voltage higher than about 10 kV to drive the internal combustion engine.

The operation described above is an ordinary normal ignition operation. When a high frequency noise such as radio noise is superposed on the gate wiring 22, as shown by the waveform (a) in FIG. 3, the gate—emitter voltage $V_{GE}$ of the voltage-controlled type semiconductor element 21 oscillates in a sinusoidal waveform in the range between 10 V and 0 V, wherein the input signal delivered by the electronic control unit 30 is assumed to be 5 V.

Figure 3:
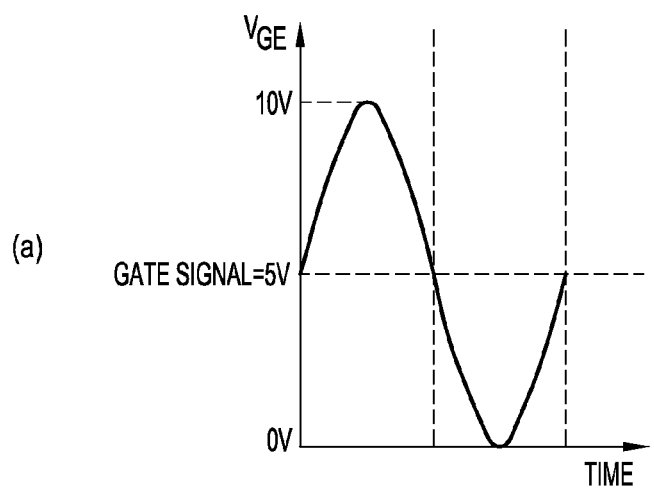
FIG. 3 shows waveforms of gate voltage and gate current with superposed high frequency noise.
Figure 3:
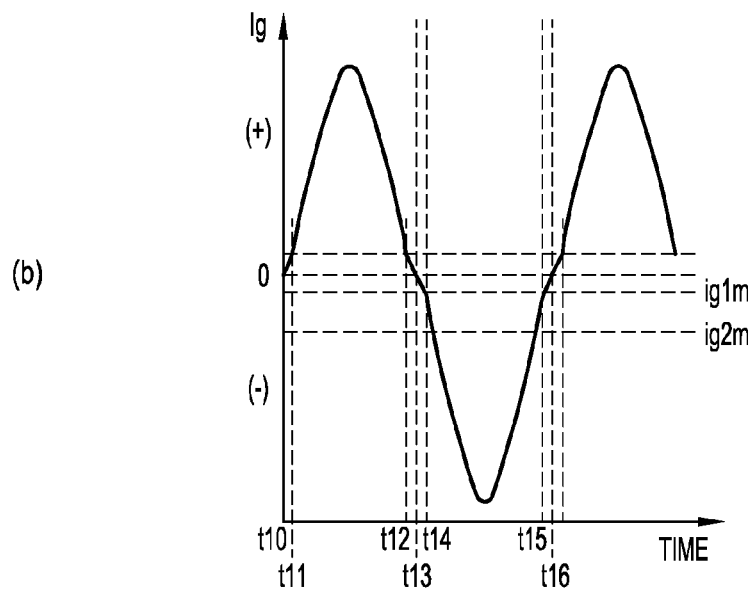
Figure 3:
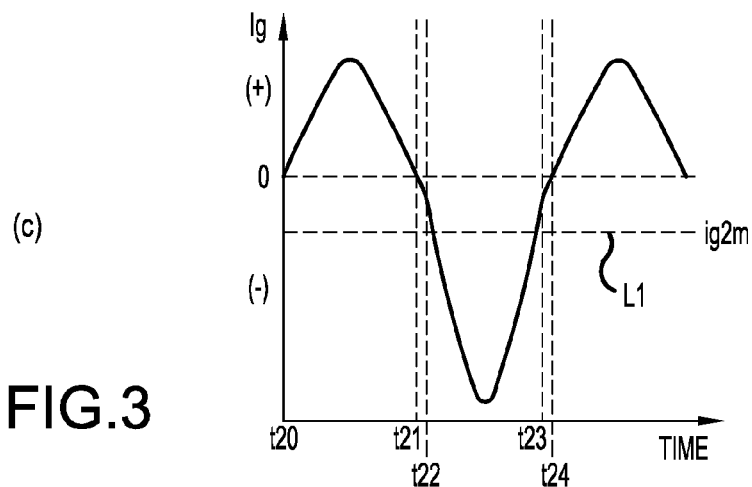

In the process, the gate current Ig of the voltage-controlled type semiconductor element 21 varies, as shown by the waveform (b) in FIG. 3, corresponding to the variation of the gate—emitter voltage $V_{GE}$. Here the positive direction of the gate current Ig is defined as the direction toward the gate of the voltage-controlled type semiconductor element 21, and the negative direction is defined as the direction from the gate of the voltage-controlled type semiconductor element 21 toward the input signal supplying side.

At the time t10, a high frequency noise begins to increase in the positive direction. During the gate voltage Vg of the voltage-controlled type semiconductor element 21 is less than the forward voltage drop Vf1, which is 0.6 V for example, of the first diode D1, the first diode D1 remains the OFF state. As a result, the current due to the high frequency noise charges the gate capacitance of the voltage-controlled type semiconductor element 21 through the first resistor R1 and the second resistor R2. The gate current Ig increases with a relatively slow dI/dt, as shown in the waveform (b) in FIG. 3.

Then at the time t11 when the gate voltage Vg reaches the forward voltage drop Vf1 of the first diode D1, the first diode D1 turns ON. As a result, the second resistor R2 is by-passed by the first diode D1 and the gate capacitance of the voltage-controlled type semiconductor element 21 is charged only through the first resistor R1 and the first diode D2. Thus, the gate current Ig sharply rises with a large dI/dt and the amplitude grows large.

Then at the time t12 when the gate voltage Vg falls below the forward voltage drop Vf1 of the first diode D1, the first diode D1 turns OFF. As a result, the gate capacitance of the voltage-controlled type semiconductor element 21 is charged again through the first resistor R1 and the second resistor R2. Thus, the variation rate dI/dt of the gate current Ig is restricted at a low value.

At the time t13, the gate current Ig becomes zero and the sign of the current reverses. The gate capacitance of the voltage-controlled type semiconductor element 21 begins to discharge toward the electronic control unit 30 and the gate current Ig start flowing in the negative direction. In the time period until the gate voltage Vg exceeds the forward voltage drop Vf2, which is 0.6 V for example, of the second diode D2, the gate current Ig flows through the first resistor R1 and the second resistor R2 and the variation rate of the current is restricted to a low dI/dt.

Then at the time t14 when the gate voltage Vg reaches the forward voltage drop Vf2 of the second diode D2, the second diode D2 turns ON. As a result, the gate capacitance of the voltage-controlled type semiconductor element 21 is discharged, by-passing the first resistor R1 and the second resistor R2, to the electronic control unit 30. The gate current Ig rises sharply in the negative direction and the amplitude also grows.

Then at the time t15 when the gate voltage Vg decreases below the forward voltage drop Vf2 of the second diode D2, the second diode D2 turns OFF and the gate capacitance of the voltage-controlled type semiconductor element 21 is discharged from the gate of the voltage-controlled type semiconductor element 21 toward the electronic control unit 30 through the first resistor R1 and the second resistor R2. Thus, the gate current Ig decreases with a small dI/dt.

Then after the time t16 when the gate current Ig returns to zero, the waveform of the gate current Ig repeats the same waveform as in the time period from the time t10 to the time t16.

In the case of superposition of high frequency noise as described above, when the gate current Ig flows from the gate terminal tg toward the gate of the voltage-controlled type semiconductor element 21, at the time the gate voltage Vg exceeds the forward voltage drop Vf1 of the first diode D1, the first diode turns ON and a turning ON pathway is formed in which the gate current Ig flows, by-passing the second resistor R2, only through the first resistor R1 to the gate of the voltage-controlled type semiconductor element 21.

On the other hand, when the gate current Ig flows from the gate of the voltage-controlled type semiconductor element 21 to the gate terminal tg, at the time the gate voltage Vg exceeds the forward voltage drop Vf2 of the second diode D2, the second diode D2 turns ON and a turning OFF pathway is formed in which the gate current Ig flows, by-passing the first resistor R1 and the second resistor R2, through the second diode D2 to the gate terminal tg.

Because the speed of charging and discharging the gate capacitance of the voltage-controlled type semiconductor element 21 can be balanced between the turning ON pathway and the turning OFF pathway, the gate current Ig can be controlled to a small difference between the amplitude in the positive direction and the amplitude in the negative direction. Thus, the average current value ig1m becomes a value near zero, as shown with a dotted line in the waveform (b) in FIG. 3.

Figure 4A:
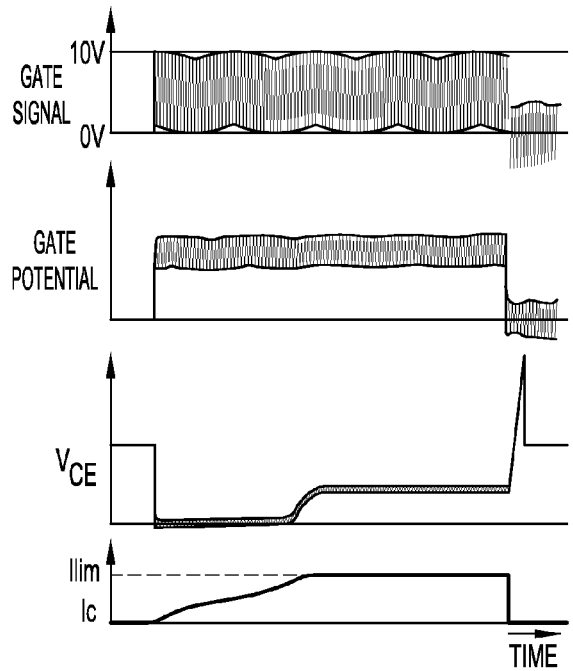
FIGS. 4A and 4B are time charts illustrating an ignition operation of the semiconductor device with superposed high frequency noise.

Consequently, even though in an ignition operation wherein high frequency noise is superposed on the input signal, the gate potential of the voltage-controlled type semiconductor element 21 is held at a high potential level required for ignition, as shown in FIG. 4A. Thus, the collector current Ic of the voltage-controlled type semiconductor element 21 increases similarly to the case without the superposition of high frequency noise and then reaches the current limiting value Ilim.

Then at the time the input signal dropped to a low level, the collector current Ic of the voltage-controlled type semiconductor element 21 returns to zero and at the same time the collector—emitter voltage of the voltage-controlled type semiconductor element 21 rises abruptly. Thus, the ignition device 12 generates spark discharge without failure.

Figure 5:
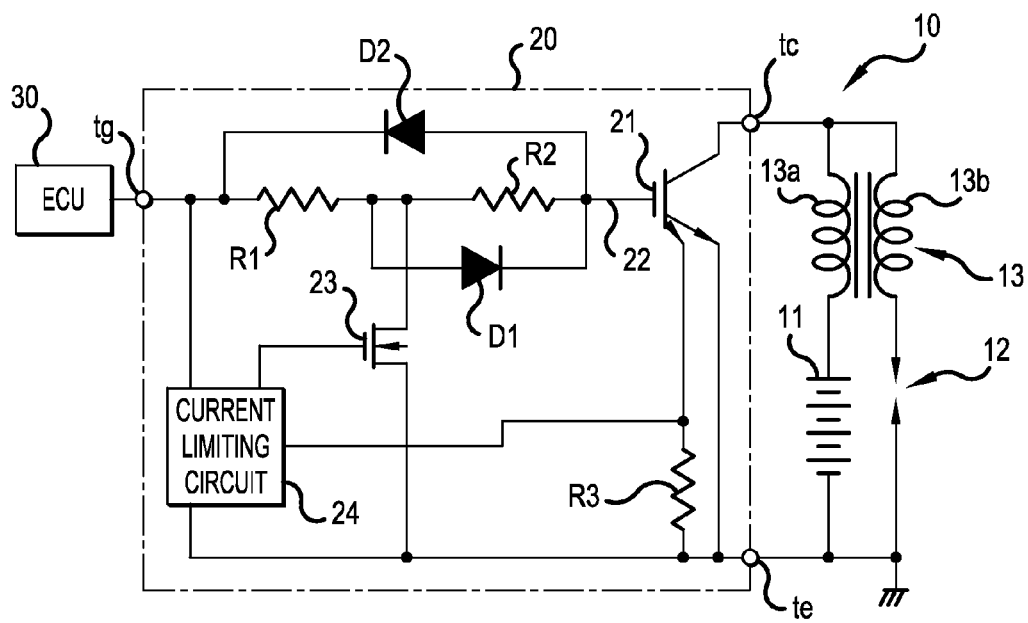
FIG. 5 is a circuit diagram of an ignition control device for an internal combustion engine from which the first diode has been removed.

If the first diode D1 is removed from the construction of FIG. 1, as shown in FIG. 5, although there is no problem when high frequency noise is not superposed on the input signal, a malfunction of failure of ignition operation occurs if the high frequency noise is superposed on the input signal.

In the circuit construction without the first diode D1, when the high frequency noise is superposed on the input signal, the gate current flows from the gate terminal tg to the gate of the voltage-controlled type semiconductor element 21 always through the first resistor R1 and the second resistor R2.

As a result, the speed of charging the gate capacitance of the voltage-controlled type semiconductor element 21 is slow and the amplitude of the gate current Ig is suppressed during the time period between the time t20 and the time t21, as shown by the waveform (c) in FIG. 3. On the other hand, during the time period between the time t22 and the time t23, the gate current Ig flows, as in the case of previously described process in the embodiment of the invention, from the gate of the voltage-controlled type semiconductor element 21 toward the gate terminal tg by-passing the first resistor R1 and the second resistor R2 by the second diode D2, Thus, the speed of discharging the gate capacitance of the voltage-controlled type semiconductor element 21 increases and the amplitude of the gate current Ig grows large.

Because the magnitude of the resistance in the gate wiring 22 significantly differs between the turning ON pathway and the turning OFF pathway, the speed of charging and discharging the gate capacitance of the voltage-controlled type semiconductor element 21 is also imbalanced and the amplitude of the gate current Ig is different, too.

Thus, the average current value ig2m of the gate current Ig with the superposition of the high frequency noise significantly decreases from zero, as indicated by the dotted line in the waveform (c) in FIG. 3, and becomes about three times of the average current value ig1m in the case the first diode D1 is provided.

Figure 4B:
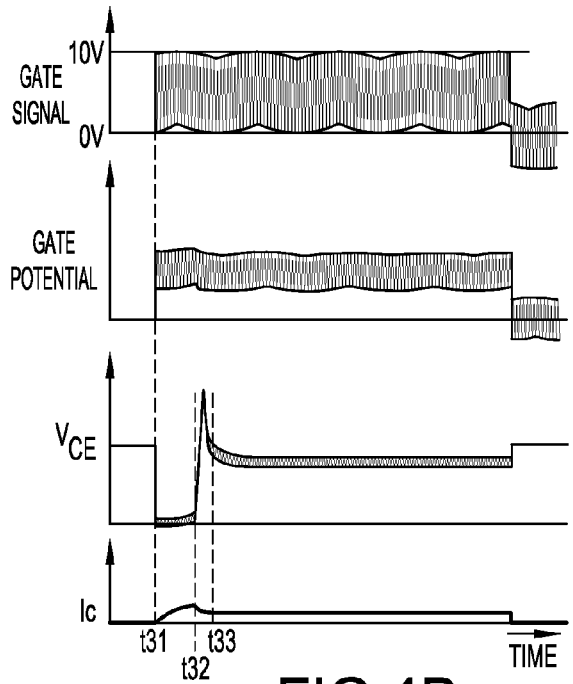

As a result, if an ignition operation is conducted when the high frequency noise is superposed on the input signal in the construction without the first diode D1, the gate potential of the voltage-controlled type semiconductor element 21 decreases as shown in FIG. 4B. The voltage-controlled type semiconductor element 21 turns ON according to the gate potential and the collector current Ic of the voltage-controlled type semiconductor element 21 increases slightly from the time t31. The collector-emitter voltage $V_{CE}$ of the voltage-controlled type semiconductor element 21 drops temporarily to nearly zero at the time t31.

However, the collector current Ic decreases from the time t32 and, after the time t33, the collector current Ic remains in a low current state. As a result, the collector—emitter voltage $V_{CE}$ is maintained at a high potential state and the voltage-controlled type semiconductor element 21 continues in a state approximately OFF state. As a result, even when the input signal reverses to a low level, the collector—emitter voltage $V_{CE}$ of the voltage-controlled type semiconductor element 21 continues at an ordinary potential. Thus, a high voltage cannot develop across the primary winding 13a of the ignition coil 13 and a voltage required for the ignition discharge in the ignition device 12 is not induced across the secondary winding 13b of the ignition coil 13.

When the collector current Ic changes from increasing to decreasing state at the time t32, the collector voltage $V_{CE}$ becomes a relatively high voltage during the period from the time t32 to the time t33. However, because the collector current Ic is scarcely flowing in this state, electromagnetic energy is little stored in the primary winding 13a of the ignition coil 13 and thus, a high voltage cannot be induced across the secondary winding 13b of the ignition coil 13.

In contrast in an embodiment of the invention, the first diode D1 is connected in parallel to the second resistor R2 and the second diode D2 is connected in parallel to the first resistor R1 and the second resistor R2. The construction can perform good balance of the charge and discharge speed of the charges accumulated on the gate capacitance of the voltage-controlled type semiconductor element 21 between the speed in the turning ON process and the speed in the turning OFF process of the voltage-controlled type semiconductor element 21. Thus, any malfunctioning of failure of ignition operation does not occur even with superposition of high frequency noise on the input signal, ensuring accurate ignition operation.

Because the first diode D1 is connected in parallel solely with the second resistor R2, the input signal is delivered to the gate of the voltage-controlled type semiconductor element 21 through the first resistor R1 having a relatively high resistance value and the first diode D1 in the process of turning ON of the voltage-controlled type semiconductor element 21. As a result, the voltage at the node between the gate terminal tg and the first resistor R1 is maintained at a high potential. Therefore, current limiting operation is performed accurately without adversely affecting the power supply function with the input signal to the current limiting circuit 24.

The embodiment example described above employs PN junction type diode or a Schottky barrier diode for the first diode D1 and the second diode D2. However, a bipolar transistor in diode operation can be used, too.

The embodiment example described above employs the first diode D1 for approximately equalizing the amplitudes of the gate current Ig in the positive direction and the negative direction when high frequency noise is superposed. However, another means can be employed to make the amplitude of the gate current Ig in the positive direction close to the amplitude in the negative direction in presence of the superposition of high frequency noise, in which the second diode D2 is composed of multistage of diodes connected in series and the number of stages of the diodes are adjusted to equalize the amplitudes.

The embodiment example described above employs the current limiting circuit 24. However, the current limiting circuit 24 can be eliminated and the procedure described below can be employed. In the ignition operation, as shown in the time chart (a) in FIG. 7, the gate voltage Vg is maintained at a predetermined voltage 5 V, for example, during the period of high level input signal between the time t41 and the time t42, to hold the voltage-controlled type semiconductor element 21 in an ON state. The turning ON of the voltage-controlled type semiconductor element 21 increases the collector current Ic as shown by the time chart (b) in FIG. 7 and decreases the collector voltage Vc to approximately zero as shown by the time chart (c) in FIG. 7. At the time t42 when the input signal turns to a low level, the gate voltage Vg is drawn out through the second diode D2 toward the electronic control unit 30. As a result, the voltage-controlled type semiconductor element 21 turns OFF and the collector current Ic drops abruptly to zero. The abrupt change of the collector current Ic induces abrupt rise of the collector voltage Vc, inducing sharp rise of the voltage across the primary winding 13a of the ignition coil 13. At the same time, the voltage across the secondary winding 13b of the ignition coil 13 rises to about 30 kV, for example, and the voltage is applied to the ignition device 12. Thus, the ignition device 12 generates stark discharge at a voltage above about 10 kV.

Figure 6A:
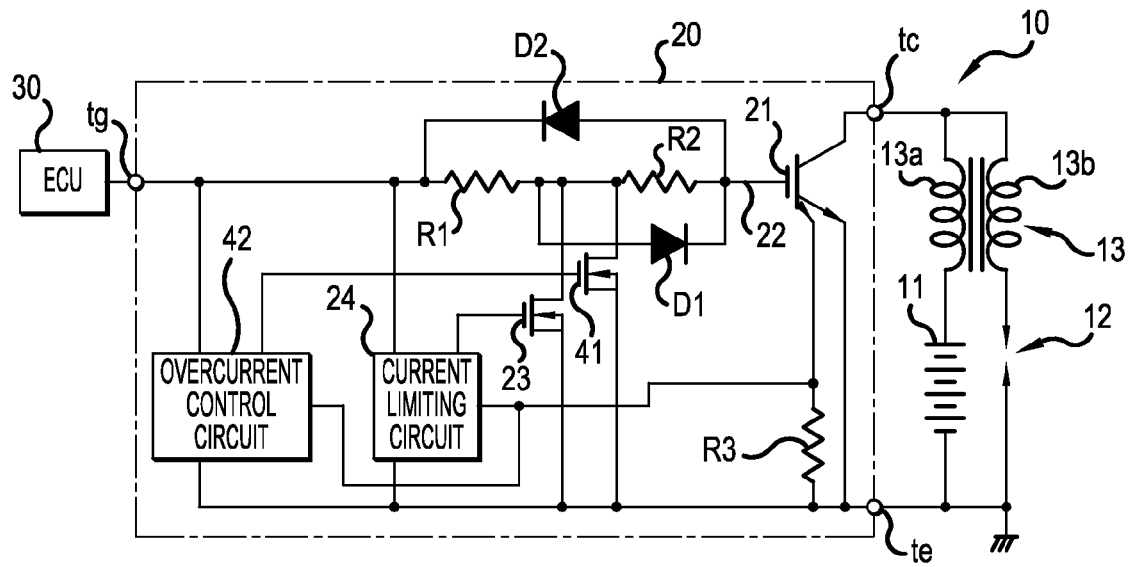
Figure 6B:
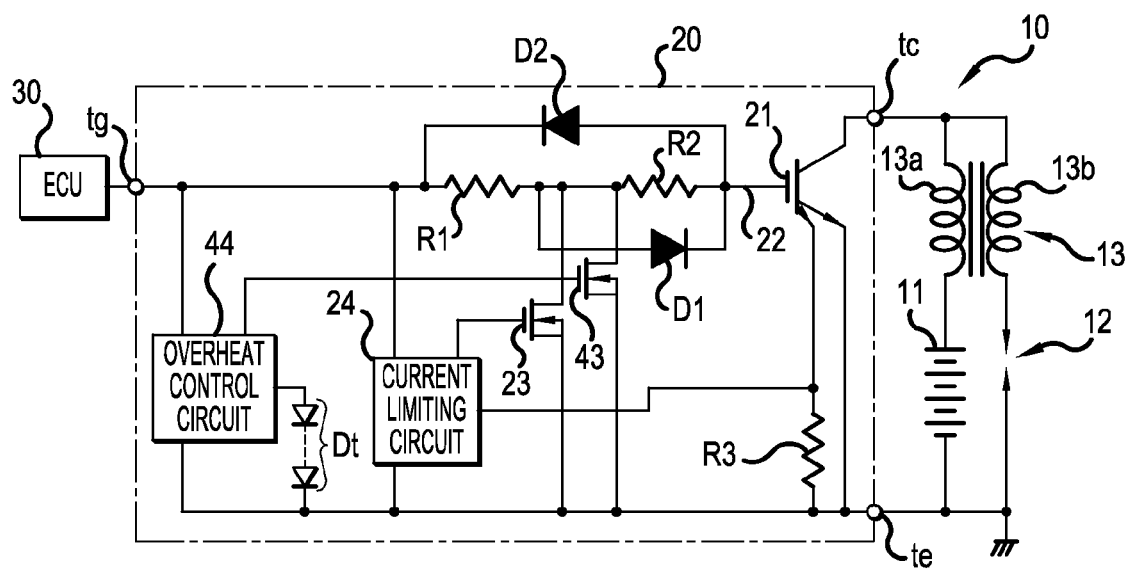

The embodiment example described above employs the current limiting circuit 24 in a current control circuit. However, the current control circuit can further comprise, as shown in FIG. 6A, an overcurrent control circuit 42 that is an abnormality control circuit for pulling down the gate voltage by turning ON an active element 41 provided in parallel to the active element 23 mentioned earlier when an overcurrent of the voltage-controlled type semiconductor element 21 is detected based on the voltage at the current sensing terminal of the resistor R3. The current control circuit can alternatively comprise, as shown in FIG. 6B, an overheat control circuit 44 that is an abnormality control circuit for pulling down the gate voltage by turning ON an active element 43 provided in parallel to the active element 23 mentioned earlier when an overheat of the voltage-controlled type semiconductor element 21 is detected based on the voltage across a diode Dt that detects the temperature of the voltage-controlled type semiconductor element 21 and is disposed within the same chip as the voltage-controlled type semiconductor element 21.

Further, the current limiting circuit 24 can be eliminated and at least one of the overcurrent control circuit 42 and the overheat control circuit 44 is provided. Because current limitation of the collector current Ic is not performed, an input signal with a rectangular waveform at a high level during the period between the time t41 and the time t42 as shown by the time chart (a) in FIG. 7 is delivered to the gate terminal tg.

Figure 7:
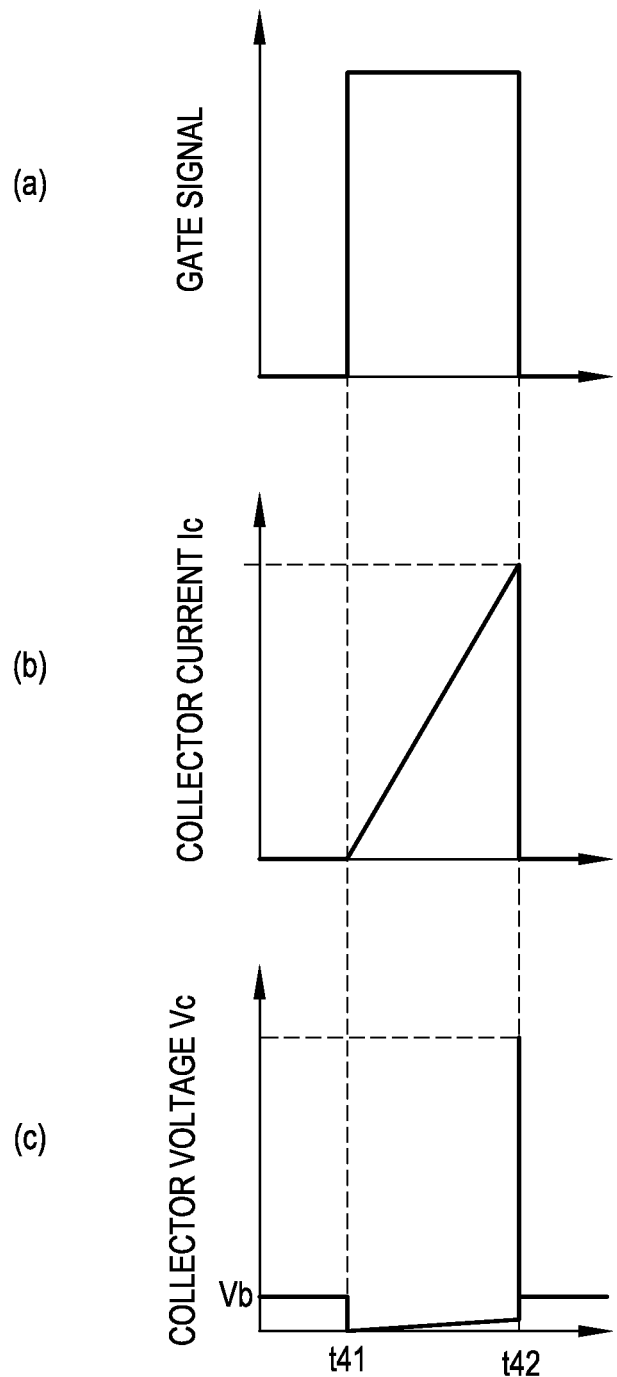
FIG. 7 shows time charts illustrating an ignition operation in which current limitation is not performed.

According to the input signal, the voltage-controlled type semiconductor element 21 turns ON and the collector current Ic increases, as shown by the time chart (b) in FIG. 7 from the time t41 with the rate dI/dt that is determined by the inductance of the primary winding 13a of the ignition coil 13 and the applied voltage. The collector current Ic returns to zero at the time t42 when the input signal reverses to a low level.

At the same time, the collector voltage Vc of the voltage-controlled type semiconductor element 21 decreases, as shown by the time chart (c) in FIG. 7, at the time t41 from the battery voltage Vb to the ground potential and then, increases gradually until the time t42 when the collector voltage Vc rises abruptly and then immediately returns to the battery potential.

As a result, at the time t42 when a high voltage is induced across the secondary winding 13b of the ignition coil 13, the ignition device 12 generates spark discharge.

In the embodiment examples described thus far, the semiconductor device 20 is composed as a one-chip igniter. However, the semiconductor device 20 can be constructed with separate chips of a voltage-controlled type semiconductor element 21 and of the current limiting circuit 24.

What is claimed is:

1. A semiconductor device comprising:
   a voltage-controlled type semiconductor element connected to a primary side of an ignition coil for supplying a voltage to an ignition device of an internal combustion engine;
   a first resistor and a second resistor inserted in series in a supplying path of an input signal for controlling a gate of the voltage-controlled type semiconductor element;
   a current control circuit for controlling current flowing through the voltage-controlled type semiconductor element;
   a first by-pass forming element that is connected in parallel to the second resistor and by-passes the second resistor in a turning ON process of the voltage-controlled type semiconductor element; and
   a second by-pass forming element that is connected in parallel to the first resistor and the second resistor and by-passes the first resistor and the second resistor in a turning OFF process of the voltage-controlled type semiconductor element;
   wherein the current control circuit includes an active element that is connected to a node between the first resistor and the second resistor and pulls down a gate voltage.

2. The semiconductor device according to claim 1, wherein the second by-pass forming element comprises a multistage of diodes and adjusts balance of times of charging and discharging the gate capacitance of the voltage-controlled type semiconductor element by changing a number of stages of the diodes.

3. The semiconductor device according to claim 1, wherein a resistance value of the first resistor is such that a gate voltage of the voltage-controlled type semiconductor element is reduced separately from the input signal when the active element in the current control circuit is turned ON.

4. The semiconductor device according to claim 1, wherein a resistance value of the second resistor is smaller than a resistance value of the first resistor and restricts variation of the gate voltage of the voltage-controlled type semiconductor element when the active element in the current control circuit is turned ON.

5. The semiconductor device according to claims 1, wherein the current control circuit comprises a current limiting circuit that controls the active element so as to limit current flowing through the voltage-controlled type semiconductor element to a constant current value.

6. The semiconductor device according to claim 1, wherein the current control circuit comprises an abnormality control circuit that controls the active element into an ON state when an abnormality in the voltage-controlled type semiconductor element is detected.

7. The semiconductor device according to claim 1, wherein an end of the second resistor is connected to the gate of the voltage-controlled type semiconductor element.

* * * * *